(12) United States Patent
Solt

(10) Patent No.: US 7,539,915 B1
(45) Date of Patent: May 26, 2009

(54) INTEGRATED CIRCUIT TESTING USING SEGMENTED SCAN CHAINS

(75) Inventor: Yosef Solt, Misgav (IL)

(73) Assignee: Marvell Israel (MISL) Ltd., Yokneam (IL)

( * ) Notice: Subject to any disclaimer, the term of this patent is extended or adjusted under 35 U.S.C. 154(b) by 543 days.

(21) Appl. No.: 10/701,008

(22) Filed: Nov. 3, 2003

Related U.S. Application Data (60) Provisional application No. 60/438,645, filed on Jan. 7, 2003.

(51) Int. Cl.
*G01R 31/28* (2006.01)
(52) U.S. Cl. ...................................... 714/726
(58) Field of Classification Search ................ None
See application file for complete search history.

(56) References Cited

U.S. PATENT DOCUMENTS

| | | | |
|---|---|---|---|
| 5,034,986 A | 7/1991 | Karmann et al. | |
| 5,043,986 A * | 8/1991 | Agrawal et al. | 714/736 |
| 5,504,756 A * | 4/1996 | Kim et al. | 714/729 |
| 5,592,493 A * | 1/1997 | Crouch et al. | 714/729 |
| 5,828,579 A | 10/1998 | Beausang | |
| 5,867,036 A * | 2/1999 | Rajsuman | 326/16 |
| 6,370,664 B1 * | 4/2002 | Bhawmik | 714/729 |
| 6,415,404 B1 * | 7/2002 | Asou | 714/726 |
| 6,434,733 B1 | 8/2002 | Duggirala et al. | |
| 6,480,980 B2 | 11/2002 | Koe | |
| 6,490,702 B1 | 12/2002 | Song et al. | |
| 6,516,432 B1 * | 2/2003 | Motika et al. | 714/732 |
| 6,560,147 B2 * | 5/2003 | Yoshiyama | 365/189.05 |
| 6,615,380 B1 * | 9/2003 | Kapur et al. | 714/738 |
| 6,658,632 B1 * | 12/2003 | Parulkar et al. | 716/4 |
| 6,728,914 B2 * | 4/2004 | McCauley et al. | 714/726 |
| 6,732,068 B2 * | 5/2004 | Sample et al. | 703/24 |
| 6,836,877 B1 * | 12/2004 | Dupenloup | 716/18 |
| 2002/0083386 A1 * | 6/2002 | McCauley et al. | 714/726 |
| 2002/0136064 A1 * | 9/2002 | Yoshiyama | 365/189.05 |
| 2003/0140293 A1 * | 7/2003 | Motika et al. | 714/726 |
| 2003/0145288 A1 * | 7/2003 | Wang et al. | 716/2 |
| 2004/0128596 A1 * | 7/2004 | Menon et al. | 714/724 |
| 2005/0283690 A1 * | 12/2005 | McLaurin | 714/726 |

* cited by examiner

*Primary Examiner*—Cynthia Britt
*Assistant Examiner*—Guerrier Merant (57) ABSTRACT

An integrated circuit, and associated method and computer program, comprises a first scan chain portion comprising a plurality of first storage elements to interconnect in series according to a signal applied to a scan shift node of the integrated circuit, an input in communication with a scan input node of the integrated circuit, and an output; a second scan chain portion comprising a plurality of second storage elements to interconnect in series according to the signal applied to the scan shift node of the integrated circuit, an input in communication with the output of the first scan chain portion, and an output; and a switch comprising a first input in communication with the output of the first scan chain portion, a second input in communication with the output of the second scan chain portion, and a switch output in communication with a scan output node of the integrated circuit, wherein the switch is to place one of the first and second inputs in communication with the switch output according to a signal applied to a scan mode node of the integrated circuit.

18 Claims, 9 Drawing Sheets

INTEGRATED CIRCUIT TESTING USING SEGMENTED SCAN CHAINS

CROSS-REFERENCE TO RELATED APPLICATIONS

This application claims the benefit of U.S. Provisional Patent Application Ser. No. 60/438,645 entitled "Dual Scan Length," filed Jan. 7, 2003, the disclosure thereof incorporated by reference herein in its entirety.

BACKGROUND

The present invention relates generally to testing integrated circuits. More particularly, the present invention relates to scan testing of integrated circuits.

Modern integrated circuits generally comprise a large number of circuit elements. It is desirable to test these circuit elements in order to ensure the proper operation of the integrated circuit. However, the number of test points (that is, locations where signals can be measured) is limited by the number of terminals of the integrated circuit, which is far less than the number of circuit elements to be tested.

Figure 1:
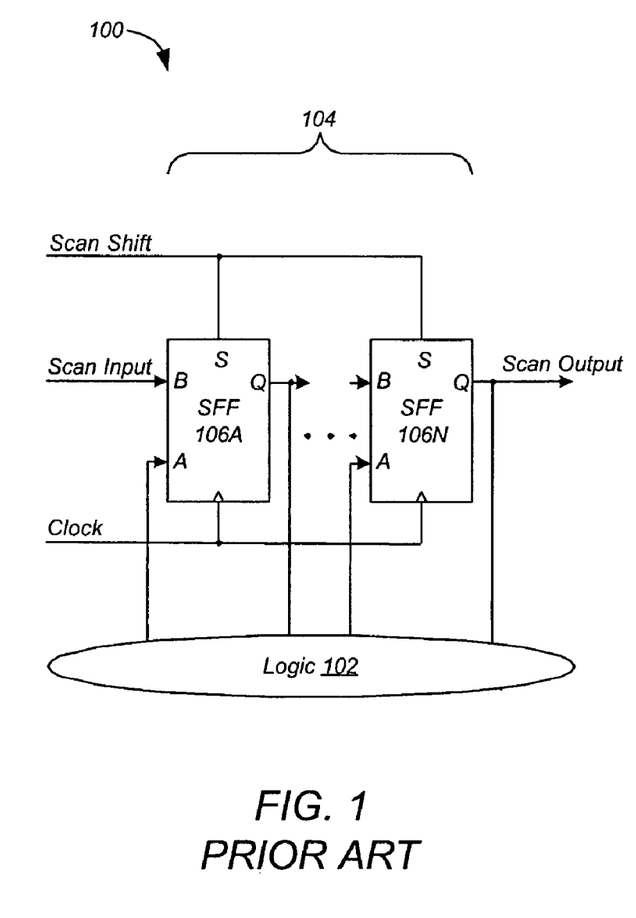
FIG. 1 shows a conventional integrated circuit designed to permit scan testing of logic circuits.

Consequently, designers of modern integrated circuits often employ a test technique referred to herein as "scan testing." FIG. 1 shows a conventional integrated circuit 100 designed to permit scan testing of logic circuits 102. According to this technique, integrated circuit 100 includes a scan chain 104 comprising a number of storage elements such as scan flip-flops (SFF) 106A through 106N that can be loaded with a test vector. The test vector is a binary number that includes bits to be loaded into SFFs 106.

Each SFF 106 has two inputs A, B and an output Q, and selects one of the inputs A, B based on a scan shift signal applied to a scan input S. Each A input is connected to logic circuits 102. Each B input is connected to the output Q of a previous SFF 106 in the scan chain 104, except for the input B of the first SFF 106 in the scan chain 104, which is connected to a scan input node, such as a scan input terminal of integrated circuit 100, that can receive a scan input signal such as a test vector. The Q output of each SFF 106 in scan chain 104 is connected both to logic circuits 102 and to the next SFF 106 in scan chain 104, except for the output Q of the last SFF 106 in scan chain 104, which is connected both to logic circuits 102 and to a scan output node, such as a scan output terminal of integrated circuit 100, to provide a scan output signal.

When the scan shift signal is negated (for example, during normal operations), each SFF 106 in scan chain 104 gates signals to and from logic circuits 102 in response to a clock signal applied to a clock input of each SFF 106. However, when the scan shift signal is asserted (for example, during scan testing), each SFF 106 gates signals from the previous SFF 106 in the scan chain 104 to the next SFF 106 in the scan chain 104 in response to the clock signal, thereby causing the SFFs 106 to interconnect serially, forming scan chain 104.

During scan test, the scan shift signal is asserted, thereby forming the scan chain 104. Then the test vector (also referred to as "scan data") is shifted into scan chain 104 as the scan input signal through the first SFF 106A in scan chain 104 in response to the clock signal. The scan shift signal is then negated, breaking scan chain 104 and restoring normal operational connections to SFF 106. The clock signal is then toggled one or more times to simulate normal operation of the integrated circuit 100. The scan shift signal is then asserted again, forming scan chain 104 again. Then the data in the SFFs 106 are shifted out of the scan chain as the scan output signal through the last SFF 106N in the scan chain in response to the clock signal. The scan output signal is then compared to a predetermined result vector to obtain a test result.

However, as the number of logic circuits in modern integrated circuits has grown, so has the number of storage elements required to test these logic circuits. The number of scan chains is limited by the number of terminals of the integrated circuit. Therefore, the length of each scan chain (that is, the number of storage elements in a scan chain) has increased. In general, the test time is defined by the length of the scan chains because most of the test cycles are consumed by shifting scan data into, and out of, the scan chains. Thus modern integrated circuits require increasingly greater test times.

SUMMARY

In general, in one aspect, the invention features an integrated circuit comprising a first scan chain portion comprising a plurality of first storage elements to interconnect in series according to a signal applied to a scan shift node of the integrated circuit, an input in communication with a scan input node of the integrated circuit, and an output; a second scan chain portion comprising a plurality of second storage elements to interconnect in series according to the signal applied to the scan shift node of the integrated circuit, an input in communication with the output of the first scan chain portion, and an output; and a switch comprising a first input in communication with the output of the first scan chain portion, a second input in communication with the output of the second scan chain portion, and a switch output in communication with a scan output node of the integrated circuit, wherein the switch is to place one of the first and second inputs in communication with the switch output according to a signal applied to a scan mode node of the integrated circuit.

Particular implementations can include one or more of the following features. The integrated circuit further comprises a plurality of circuits comprising first circuits and second circuits; wherein the first circuits are in communication with further inputs of the first storage elements; and wherein the second circuits are in communication with further inputs of the second storage elements. The first circuits have a high complexity; and wherein the second circuits have a low complexity. The first circuits have a greater number than the second circuits of at least one of the group consisting of logic depth; gates; gate inputs; and gate outputs. Each of the first and second storage elements comprises a flip-flop. The first scan chain portion is further to receive a test vector when the first storage elements are interconnected in series. The first scan chain portion is further to transmit a results vector when the first storage elements are interconnected in series.

In general, in one aspect, the invention features a method and computer program for testing an integrated circuit comprising a scan chain having a first scan chain portion comprising a plurality of first storage elements followed by a second scan chain portion comprising a plurality of second storage elements. It comprises interconnecting the first storage elements in series; inserting a test vector into the first scan chain portion; disconnecting the first storage elements from each other; applying a clock signal to respective clock inputs of the first storage elements; interconnecting the first storage elements in series; bypassing the second scan chain portion; and extracting a results vector from the first scan chain portion.

Particular implementations can include one or more of the following features. The integrated circuit further comprises a plurality of circuits comprising first circuits and second circuits, wherein the first circuits are in communication with inputs of the first storage elements; and wherein the second circuits are in communication with inputs of the second storage elements. The first circuits have a high complexity; and wherein the second circuits have a low complexity. The first circuits have a greater number than the second circuits of at least one of the group consisting of logic depth; gates; gate inputs; and gate outputs.

In general, in one aspect, the invention features an integrated circuit comprising a first scan chain portion comprising a plurality of first storage elements to interconnect in series according to a signal applied to a scan shift node of the integrated circuit, an input in communication with a scan input node of the integrated circuit, and an output; a second scan chain portion comprising a plurality of second storage elements to interconnect in series according to the signal applied to the scan shift node of the integrated circuit, an input in communication with the output of the first scan chain portion, and an output in communication with a scan output node of the integrated circuit; and a switch comprising a first input in communication with the scan input node of the integrated circuit, a second input in communication with the output of the first scan chain portion, and a switch output in communication with the input of the second scan chain portion, wherein the switch is to place one of the first and second inputs in communication with the switch output according to a signal applied to a scan mode node of the integrated circuit.

Particular implementations can include one or more of the following features. The integrated circuit further comprises a plurality of circuits comprising first circuits and second circuits; wherein the first circuits are in communication with further inputs of the second storage elements; and wherein the second circuits are in communication with further inputs of the first storage elements. The first circuits have a high complexity; and wherein the second circuits have a low complexity. The first circuits have a greater number than the second circuits of at least one of the group consisting of logic depth; gates; gate inputs; and gate outputs. Each of the first and second storage elements comprises a flip-flop. The first scan chain portion is further to receive a test vector when the first storage elements are interconnected in series. The first scan chain portion is further to transmit a results vector when the first storage elements are interconnected in series.

In general, in one aspect, the invention features a method and computer program for testing an integrated circuit comprising a scan chain having a first scan chain portion comprising a plurality of first storage elements followed by a second scan chain portion comprising a plurality of second storage elements. It comprises interconnecting the second storage elements in series; disconnecting the first and second scan chain portions from each other; and inserting a test vector into the second scan chain portion; disconnecting the second storage elements from each other; applying a clock signal to respective clock inputs of the second storage elements; interconnecting the second storage elements in series; and extracting a results vector from the second scan chain portion.

Particular implementations can include one or more of the following features. The integrated circuit further comprises a plurality of circuits comprising first circuits and second circuits, wherein the first circuits are in communication with inputs of the first storage elements; and wherein the second circuits are in communication with inputs of the second storage elements. The first circuits have a high complexity; and wherein the second circuits have a low complexity. The first circuits have a greater number than the second circuits of at least one of the group consisting of logic depth; gates; gate inputs; and gate outputs.

In general, in one aspect, the invention features an integrated circuit comprising a first scan chain portion comprising a plurality of first storage elements to interconnect in series according to a signal applied to a scan shift node of the integrated circuit, an input in communication with a scan input node of the integrated circuit, and an output; a second scan chain portion comprising a plurality of second storage elements to interconnect in series according to the signal applied to the scan shift node of the integrated circuit, an input in communication with the output of the first scan chain portion, and an output; a third scan chain portion comprising a plurality of third storage elements to interconnect in series according to the signal applied to the scan shift node of the integrated circuit, an input in communication with the output of the second scan chain portion, and an output; and a first switch comprising a first input in communication with the scan input node of the integrated circuit, a second input in communication with the output of the first scan chain portion, and a switch output in communication with the input of the second scan chain portion, wherein the first switch is to place one of the first and second inputs of the first switch in communication with the switch output of the first switch according to a signal applied to a scan mode node of the integrated circuit; a second switch comprising a first input in communication with the output of the second scan chain portion, a second input in communication with the output of the third scan chain portion, and a switch output in communication with a scan output node of the integrated circuit; wherein the second switch is to place one of the first and second inputs of the second switch in communication with the switch output of the second switch according to the signal applied to the scan mode node of the integrated circuit.

Particular implementations can include one or more of the following features. The integrated circuit further comprises a plurality of circuits comprising first circuits and second circuits; wherein the first circuits are in communication with further inputs of the second storage elements; and wherein the second circuits are in communication with further inputs of the first or third storage elements. The first circuits have a high complexity; and wherein the second circuits have a low complexity. The first circuits have a greater number than the second circuits of at least one of the group consisting of logic depth; gates; gate inputs; and gate outputs. Each of the first, second, and third storage elements comprises a flip-flop. The second scan chain portion is further to receive a test vector when the second storage elements are interconnected in series. The second scan chain portion is further to transmit a results vector when the second storage elements are interconnected in series.

In general, in one aspect, the invention features a method and computer program for testing an integrated circuit comprising a scan chain having a first scan chain portion comprising a plurality of first storage elements followed by a second scan chain portion comprising a plurality of second storage elements followed by a third scan chain portion comprising a plurality of third storage elements. It comprises interconnecting the second storage elements in series; disconnecting the first and second scan chain portions from each other; inserting a test vector into the second scan chain portion; disconnecting the second storage elements from each other; applying a clock signal to respective clock inputs of the second storage elements; interconnecting the second storage elements in series; bypassing the third scan chain portion; and extracting a results vector from the second scan chain portion.

Particular implementations can include one or more of the following features. The integrated circuit further comprises a plurality of circuits comprising first circuits and second circuits wherein the first circuits are in communication with inputs of the first storage elements; and wherein the second circuits are in communication with inputs of the second storage elements. The first circuits have a high complexity; and wherein the second circuits have a low complexity. The first circuits have a greater number than the second circuits of at least one of the group consisting of logic depth; gates; gate inputs; and gate outputs.

In general, in one aspect, the invention features an integrated circuit comprising a first scan chain portion comprising a plurality of first storage elements to interconnect in series according to a signal applied to a scan shift node of the integrated circuit, an input in communication with a scan input node of the integrated circuit, and an output; a second scan chain portion comprising a plurality of second storage elements to interconnect in series according to the signal applied to the scan shift node of the integrated circuit, an input in communication with the scan input node of the integrated circuit, and an output; and a switch comprising a first input in communication with the output of the first scan chain portion, a second input in communication with the output of the second scan chain portion, and a switch output in communication with a scan output node of the integrated circuit, wherein the switch is to place one of the first and second inputs in communication with the switch output according to a signal applied to a scan mode node of the integrated circuit.

Particular implementations can include one or more of the following features. The integrated circuit further comprises a plurality of circuits comprising first circuits and second circuits; wherein the first circuits are in communication with further inputs of the first storage elements; and wherein the second circuits are in communication with further inputs of the second storage elements. The first circuits have a high complexity; and wherein the second circuits have a low complexity. The first circuits have a greater number than the second circuits of at least one of the group consisting of logic depth; gates; gate inputs; and gate outputs. Each of the first and second storage elements comprises a flip-flop. The first scan chain portion is further to receive a test vector when the first storage elements are interconnected in series. The first scan chain portion is further to transmit a results vector when the first storage elements are interconnected in series.

In general, in one aspect, the invention features a method and computer program for testing an integrated circuit comprising a scan chain having a first scan chain portion comprising a plurality of first storage elements and a second scan chain portion comprising a plurality of second storage elements, wherein the inputs of the first and second scan chain portions are in communication with a scan input node of the integrated circuit. It comprises interconnecting the first storage elements in series; inserting a test vector into the first scan chain portion; disconnecting the first storage elements from each other; applying a clock signal to respective clock inputs of the first storage elements; interconnecting the first storage elements in series; connecting the first scan chain portion to a scan output node of the integrated circuit; and extracting a results vector from the first scan chain portion.

Particular implementations can include one or more of the following features. The integrated circuit further comprises a plurality of circuits comprising first circuits and second circuits wherein the first circuits are in communication with inputs of the first storage elements; and wherein the second circuits are in communication with inputs of the second storage elements. The first circuits have a high complexity; and wherein the second circuits have a low complexity. The first circuits have a greater number than the second circuits of at least one of the group consisting of logic depth; gates; gate inputs; and gate outputs.

The details of one or more implementations are set forth in the accompanying drawings and the description below. Other features will be apparent from the description and drawings, and from the claims.

The leading digit(s) of each reference numeral used in this specification indicates the number of the drawing in which the reference numeral first appears.

DETAILED DESCRIPTION

The inventor has recognized that most of the logic circuits requiring test in a typical integrated circuit are of low complexity, and therefore require few test patterns, while only a few of the logic circuits requiring test are of high complexity. However, the circuits of high complexity require many test patterns. When a single scan chain comprises circuits of high and low complexity, the entire scan chain must be tested with all of the test patterns.

Accordingly, embodiments of the present invention comprise scan chains that are segmented in different ways so that one can test a portion of the scan chain. In some embodiments, the scan chains are segmented according to the complexity of the logic circuits tested by the scan chains, so that one portion of the scan chain tests logic circuits of high complexity, while another portion tests circuits of low complexity. In some embodiments, the portion of the scan chain that tests logic circuits of high complexity can be tested independently. In general, this portion is only a small fraction of the entire scan chain, so that far fewer test cycles are required to shift scan data into, and out of, the tested portion.

Preferably the complexity of a logic circuit is defined by its logic depth, which can be characterized for a given flip-flop in a scan chain by the maximum number of gates a signal can traverse through the logic circuit between the given flip-flop and another flip-flop in the scan chain. Of course, the complexity of a logic circuit can be defined by other measures, such as by the number of gates in the logic circuit, the number of gate inputs and/or outputs in the logic circuit, and the like.

Figure 2:
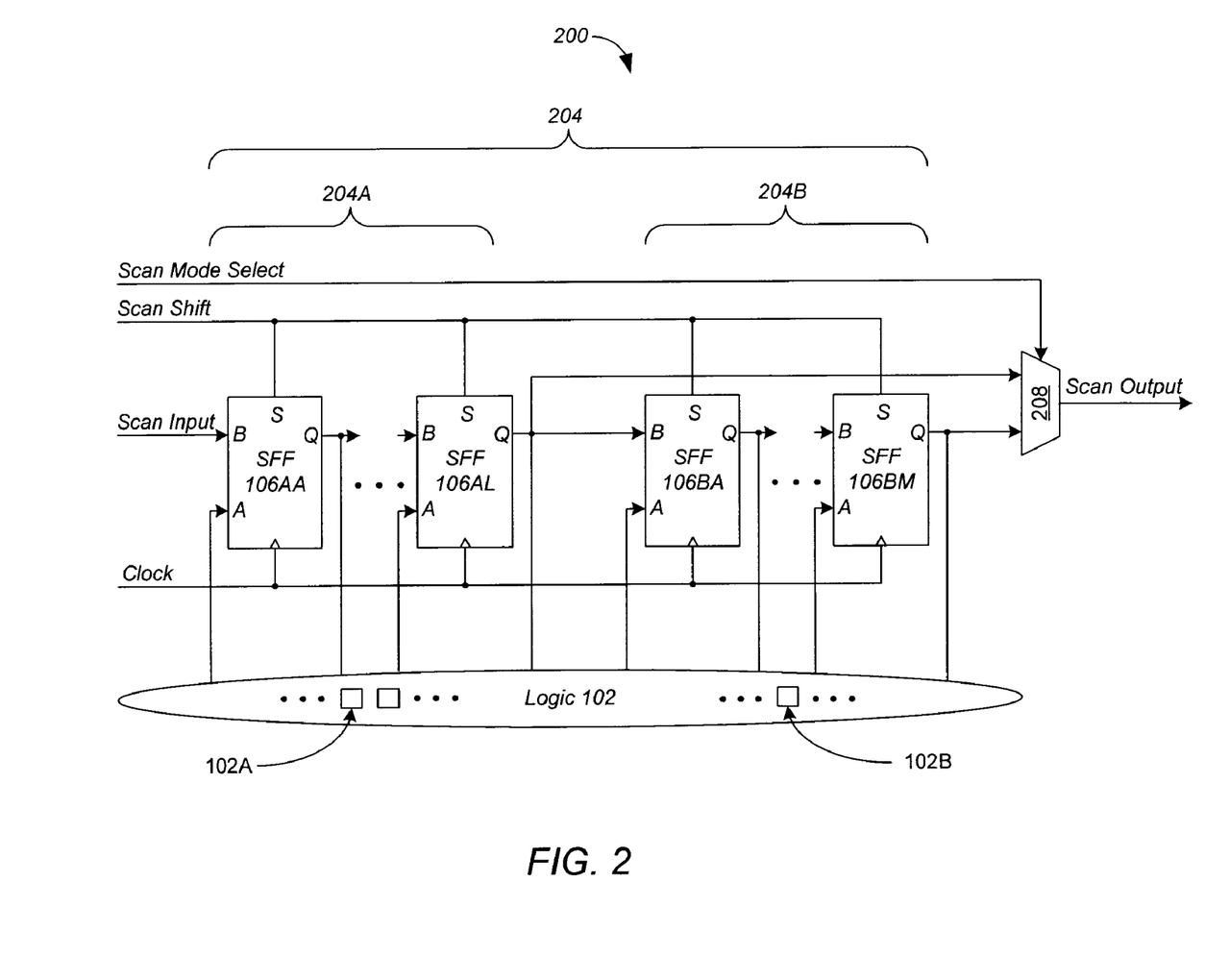
FIG. 2 shows an integrated circuit according to a preferred embodiment of the present invention.

FIG. 2 shows an integrated circuit 200 according to a preferred embodiment of the present invention. Integrated circuit 200 comprises logic circuits 102 and a scan chain 204 comprising a first portion 204A, a second portion 204B, and a switch such as multiplexer 208. The logic circuits 102 may include first circuits 102A and second circuits 102B. The first circuits 102A may have a higher complexity than the second circuits 102B. Moreover, the first circuits 102A may be provided in greater quantity than the second circuits 102B. First scan chain portion 204A comprises L storage element such as scan flip-flops (SFF) 106AA through 106AL. Second scan chain portion 204B comprises M storage elements such as SFF 106BA through 106BM.

Multiplexer 208 operates under the control of a scan mode select signal to isolate first scan chain portion 204A by connecting the output of first scan chain portion 204A (that is, the output Q of the last SFF 106AL in first scan chain portion 204A) to the scan output node of scan chain 204.

In a preferred embodiment, the first scan chain portion 204A is connected to the logic circuits 102 of high complexity so that the test patterns for those circuits need not be shifted through the entire scan chain 204. In addition, the test patterns can be shorter, as they only need be as long as the scan chain portion being tested. For example, suppose that 20% of logic circuits 102 contain 80% of the complexity of logic circuits 102, and that 80% of the test patterns are devoted to testing 20% of logic circuits 102. According to this embodiment, those 80% of the test patterns now need be shifted through only 20% of scan chain 204, resulting in substantial savings in test time. In the 80/20 example, test time can be reduced by 64%. In a 90/10 example, test time can be reduced by 74%.

Figure 3:
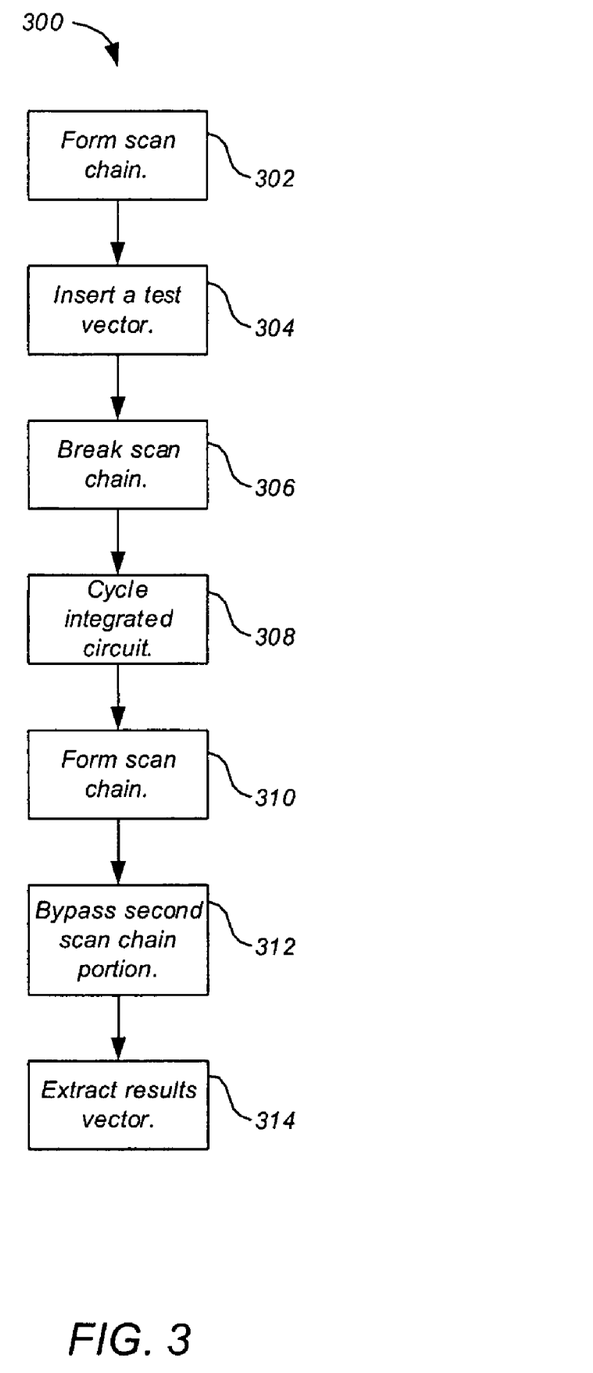
FIG. 3 is a flowchart of a process for the integrated circuit of FIG. 2.

FIG. 3 is a flowchart of a process 300 for integrated circuit 200. Process 300 can be implemented, for example, as software executing on a tester in communication with integrated circuit 200. Process 300 forms scan chain 204 (step 302) by asserting the scan shift signal to interconnect the SFFs 106 of the first and second scan chain portions in series. Process 300 then inserts a test vector into the first scan chain portion 204A (step 304) by applying the test vector as the scan input signal to the input B of the first SFF 106AA in scan chain 204 and toggling the clock signal L times. Process 300 then breaks the scan chain (step 306) by negating the scan shift signal to disconnect the first and second SFFs 106 from each other.

Process 300 then cycles integrated circuit 200 (step 308) by toggling the clock signal one or more times. Process 300 then forms scan chain 204 again (step 310) and bypasses the second scan chain portion 204B (step 312) by asserting the scan mode select signal, which causes multiplexer 208 to connect the output Q of the last SFF 106AL of the first scan chain portion 204A to the scan output node. Process 300 then extracts a results vector (the data stored in SFFs 106AA through 106AL) from the first scan chain portion 204A (step 314). Because the scan data need not be shifted through the second scan chain portion 204B, significant test time is saved.

Process 300 can control the contents of second scan chain portion 204B according to any number of schemes. For example, process 300 can shift a test vector through first scan chain portion 204A into second scan chain portion 204B, reset the flip-flops 106B in second scan chain portion 204B to a known value, or simply leave the contents of second scan chain portion 204B as they are.

Figure 4:
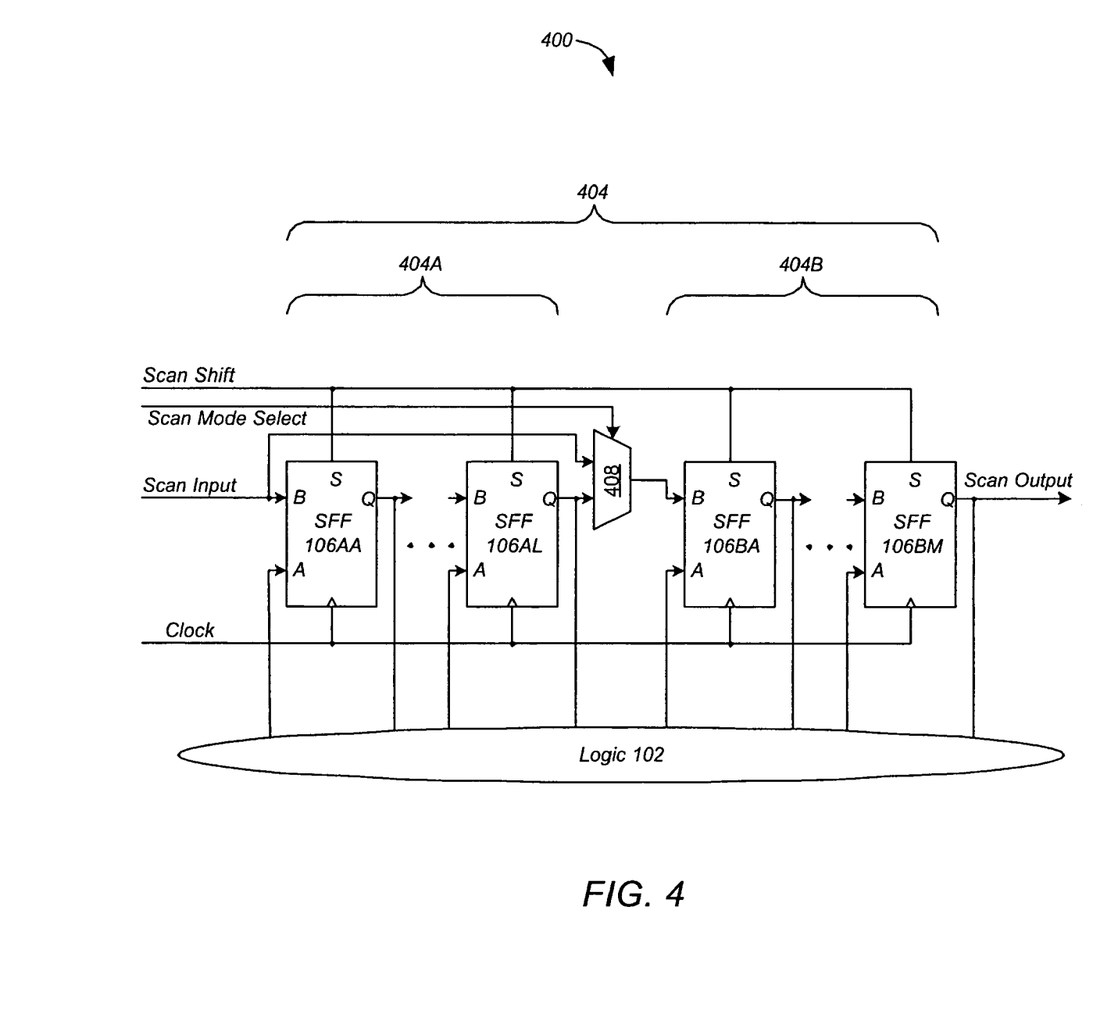
FIG. 4 shows an integrated circuit according to a preferred embodiment of the present invention.

FIG. 4 shows an integrated circuit 400 according to a preferred embodiment of the present invention. Integrated circuit 400 comprises logic circuits 102 and a scan chain 404 comprising a first portion 404A, a second portion 404B, and a switch such as multiplexer 408. First scan chain portion 404A comprises L storage elements such as scan flip-flops (SFF) 106AA through 106AL. Second scan chain portion 404B comprises M storage elements such as SFF 106BA through 106BM.

Multiplexer 408 operates under the control of a scan mode select signal to isolate second scan chain portion 404B by connecting the input of second scan chain portion 404B (that is, the B input of the first SFF 106BA in second scan chain portion 404B) to the input of scan chain 404 (that is, the B input of the first SFF 106AA in scan chain 404).

In a preferred embodiment, the second scan chain portion 404B is connected to the logic circuits 102 of high complexity so that the test patterns for those circuits need not be shifted through the entire scan chain 404.

Figure 5:
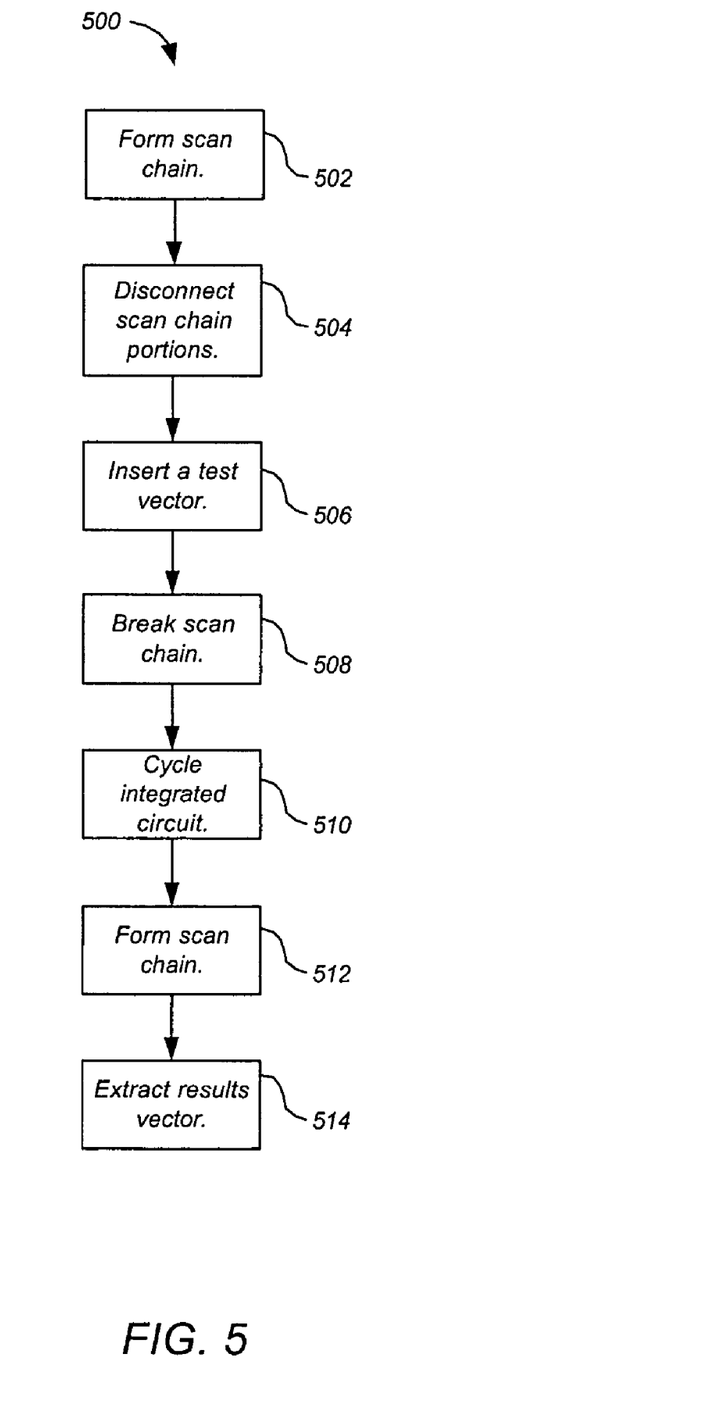
FIG. 5 is a flowchart of a process for the integrated circuit of FIG. 4.

FIG. 5 is a flowchart of a process 500 for integrated circuit 400. Process 500 can be implemented, for example, as software executing on a tester in communication with integrated circuit 400. Process 500 forms scan chain 404 (step 502) by interconnecting the SFFs 106 of the first and second scan chain portions 404 in series to form scan chain 404, preferably by asserting the scan shift signal. Process 500 disconnects the first and second scan chain portions 404 from each other (step 504) by asserting the scan mode select signal, which causes multiplexer 408 to connect the B input of the first SFF 106BA of the second scan chain portion 404B to the scan input node.

Process 500 inserts a test vector into the second scan chain portion 404B (step 506) by applying the test vector as the scan input signal and toggling the clock signal L times, which shifts the test vector through multiplexer 408 and into the input B of SFF 106BA. Process 500 then breaks the scan chain (step 508) by disconnecting the first and second SFFs 106 from each other, preferably by negating the scan shift signal.

Process 500 cycles integrated circuit 400 (step 510) by toggling the clock signal one or more times. Process 500 then forms scan chain 404 again (step 512).

Process 500 then extracts a results vector (the data stored in SFFs 106BA through 106BM) from the second scan chain portion 404B (step 514). Because the scan data need not be shifted through the first scan chain portion 404A, significant test time is saved.

Process 500 can control the contents of first scan chain portion 404A according to any number of schemes. For example, process 500 can shift a test vector into first scan chain portion 404A, reset the flip-flops 106A in first scan chain portion 404A to a known value, or simply leave the contents of first scan chain portion 404A as they are.

Figure 6:
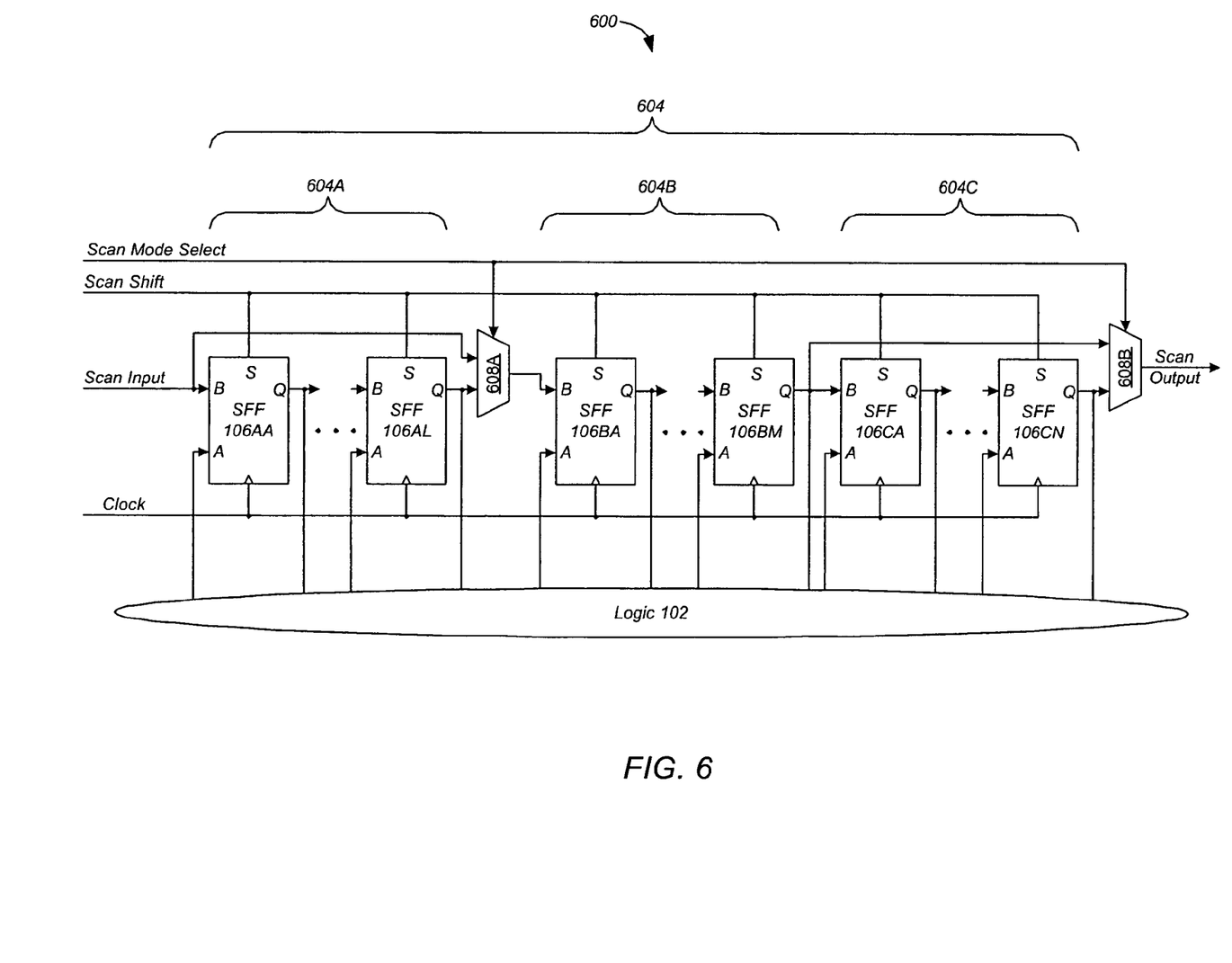
FIG. 6 shows an integrated circuit according to a preferred embodiment of the present invention.

FIG. 6 shows an integrated circuit 600 according to a preferred embodiment of the present invention. Integrated circuit 600 comprises logic circuits 102 and a scan chain 604 comprising a first portion 604A, a second portion 604B, a third portion 604C, and two switches such as multiplexers 608A and 608B. First scan chain portion 604A comprises L storage elements such as scan flip-flops (SFF) 106AA through 106AL. Second scan chain portion 604B comprises M storage elements such as SFF 106BA through 106BM. Third scan chain portion 604C comprises N storage elements such as SFF 106CA through 106CN.

Multiplexers 608A and 608B operate under the control of a scan mode select signal to isolate second scan chain portion 604B. When the scan mode select signal is asserted, multiplexer 608A connects the input of second scan chain portion 604B (that is, the B input of the first SFF 106BA in second scan chain portion 604B) to the scan input node of scan chain 604 (that is, the B input of the first SFF 106AA in scan chain 604), and multiplexer 608B connects the output of second scan chain portion 604B (that is, the output Q of the last SFF 106BM in second scan chain portion 604B) to the scan output node of scan chain 604 (that is, the output Q of the last SFF 106CN in scan chain 604). Of course, multiplexers 608 can be operated independently to isolate different parts of scan chain 604.

In a preferred embodiment, the second scan chain portion 604B is connected to the logic circuits 102 of high complexity so that the test patterns for those circuits need not be shifted through the entire scan chain 604.

Figure 7:
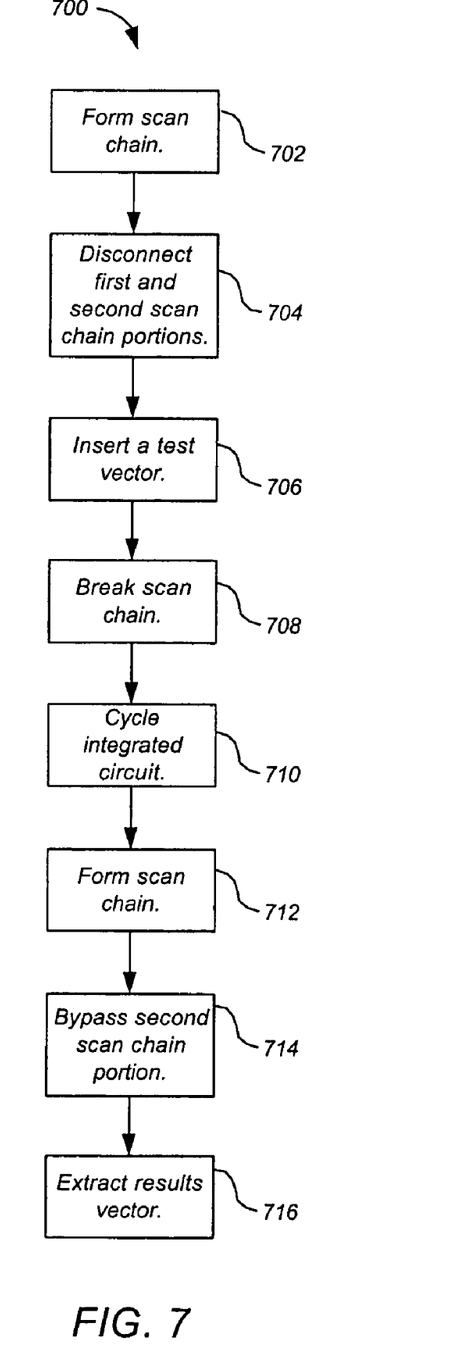
FIG. 7 is a flowchart of a process for the integrated circuit of FIG. 6.

FIG. 7 is a flowchart of a process 700 for integrated circuit 600. Process 700 can be implemented, for example, as software executing on a tester in communication with integrated circuit 600. Process 700 forms scan chain 604 (step 702) by asserting the scan shift signal to interconnect the SFFs 106 of the first, second and third scan chain portions in series to form scan chain 604. Process 700 disconnects the first and second scan chain portions from each other (step 704) by asserting the scan mode select signal, which causes multiplexer 608A to connect the B input of the first SFF 106BA of the second scan chain portion 604B to the scan input node.

Process 700 then inserts a test vector into the second scan chain portion 604B (step 706) by applying the test vector as the scan input signal and toggling the clock signal L times, which shifts the test vector through multiplexer 608A and into the input B of SFF 106BA. Process 700 then breaks the scan chain (step 708) by negating the scan shift signal to disconnect the first, second and third SFFs 106 from each other.

Process 700 cycles integrated circuit 600 (step 710) by toggling the clock signal one or more times. Process 700 then forms scan chain 604 again (step 712) and bypasses the third scan chain portion 604C (step 714) by asserting the scan mode select signal, which causes multiplexer 608 to connect the output Q of the last SFF 106BM of the second scan chain portion 604B to the scan output node.

Process 700 then extracts a results vector (the data stored in SFFs 106BA through 106BM) from the second scan chain portion 604B (step 716). Because the scan data need not be shifted through the first scan chain portion 604A or the third scan chain portion 604C, significant test time is saved.

Process 700 can control the contents of first and third scan chain portions 604A and 604C according to any number of schemes. For example, process 700 can shift a test vector through scan chain 604 into first and third scan chain portions 604A and 604C, reset the flip-flops 106A and 106C in first and third scan chain portions 604A and 604C to a known value, or simply leave the contents of first and third scan chain portions 604A and 604C as they are.

Figure 8:
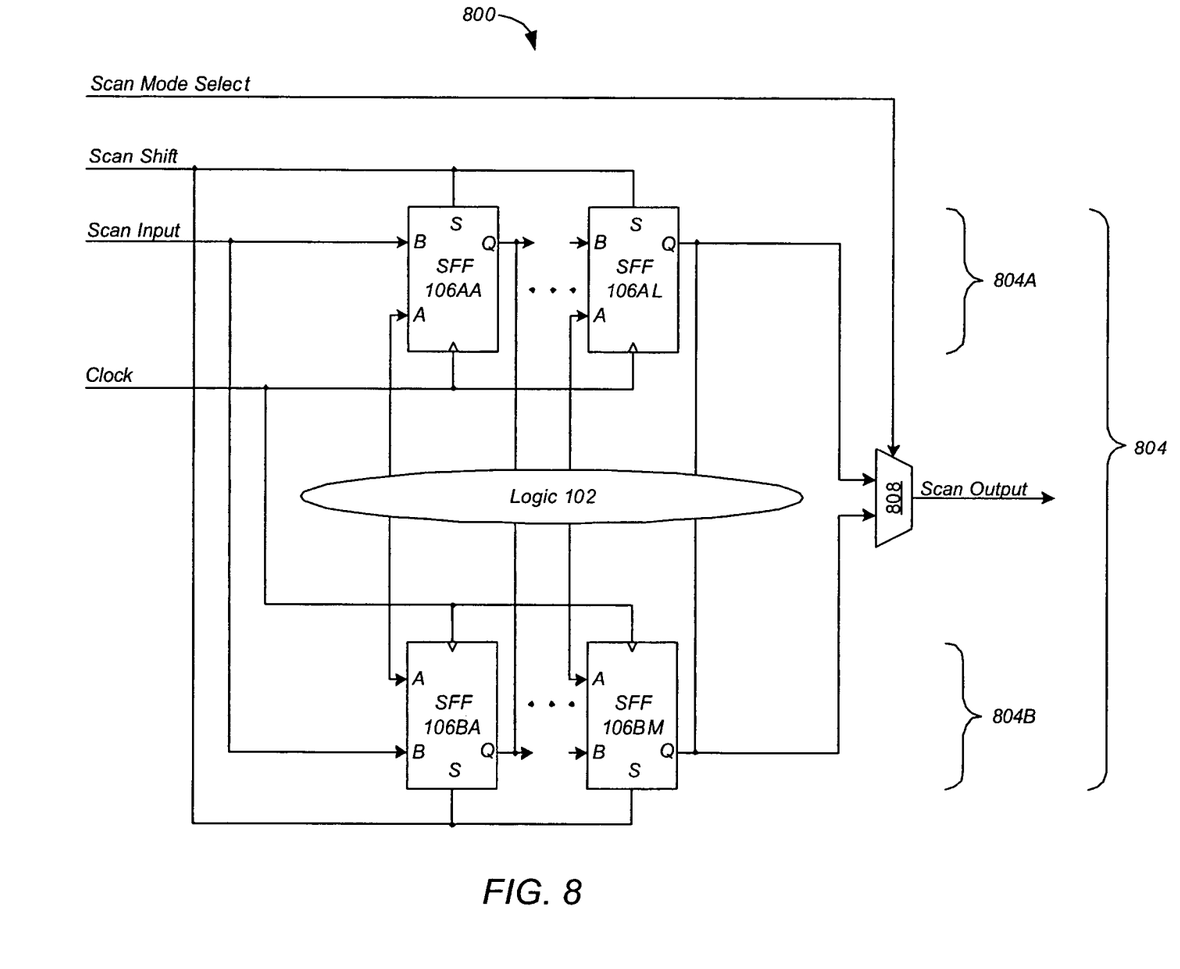
FIG. 8 shows an integrated circuit according to a preferred embodiment of the present invention.

FIG. 8 shows an integrated circuit 800 according to a preferred embodiment of the present invention. Integrated circuit 800 comprises logic circuits 102 and a parallel scan chain 804 comprising a first portion 804A, a second portion 804B, and a switch such as multiplexer 808. First scan chain portion 804A comprises L storage elements such as scan flip-flops (SFF) 106AA through 106AL. Second scan chain portion 804B comprises M storage elements such as SFF 106BA through 106BM.

Scan chain portions 804A and 804B are connected in parallel to a single scan input node. Multiplexer 808 operates under the control of a scan mode select signal to select one of the scan chain portions by connecting either the output of first scan chain portion 804A (that is, the output Q of the last SFF 106AL in first scan chain portion 804A) or the output of second scan chain portion 804B (that is, the output Q of the last SFF 106BM in second scan chain portion 804B) to the scan output node of scan chain 804.

In a preferred embodiment, only one of the scan chain portions is connected to the logic circuits 102 of high complexity so that the test patterns for those circuits need not be shifted through both scan chain portions.

Figure 9:
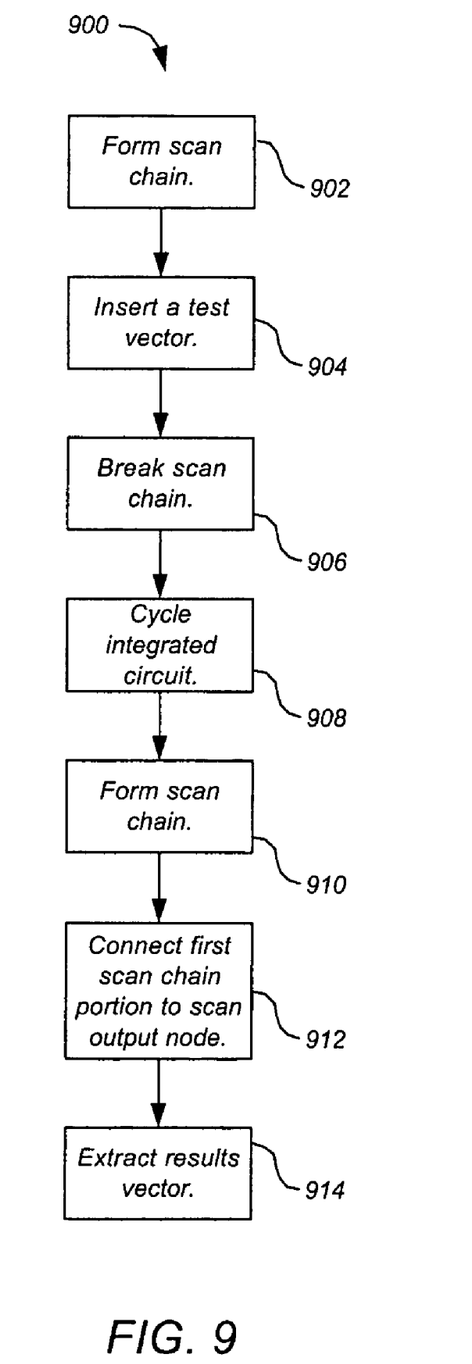
FIG. 9 is a flowchart of a process for the integrated circuit of FIG. 8.

FIG. 9 is a flowchart of a process 900 for integrated circuit 800. Process 900 can be implemented, for example, as software executing on a tester in communication with integrated circuit 800. Process 900 forms scan chain 804 (step 902) by asserting the scan shift signal to interconnect the SFFs 106 of the first and second scan chain portions 804 in series. However, in this embodiment, the scan chain portions are connected in parallel, rather than in series as with the above embodiments. Process 900 then inserts a test vector into the first scan chain portion 804A (step 904) by applying the test vector as the scan input signal to the scan input node of scan chain 804 and toggling the clock signal L times. Process 900 then breaks the scan chain (step 906) by negating the scan shift signal to disconnect the first and second SFFs 106 from each other.

Process 900 then cycles integrated circuit 800 (step 908) by toggling the clock signal one or more times. Process 900 then forms scan chain 804 again (step 910) and connects the first scan chain portion 804A to the scan output node (step 912) by asserting the scan mode select signal, which causes multiplexer 808 to connect the output Q of the last SFF 106AL of the first scan chain portion 804A to the scan output node. Process 900 then extracts a results vector (the data stored in SFFs 106AA through 106AL) from the first scan chain portion 804A (step 914). Because the scan data need not be shifted through the second scan chain portion 804B, significant test time is saved.

Process 900 can control the contents of second scan chain portion 804B according to any number of schemes. For example, process 900 can shift the same test vector into both first scan chain portion 804A into second scan chain portion 804B, reset the flip-flops 106B in second scan chain portion 804B to a known value, or simply leave the contents of second scan chain portion 804B as they are, for example by adding an additional multiplexer at the inputs to scan chain portions 804A and 804B.

The techniques presented above can be used to segment a scan chain into any number of portions, and to isolate any lesser number of those portions. The portions can be assigned to circuitry based on metrics other than complexity.

The invention can be implemented in digital electronic circuitry, or in computer hardware, firmware, software, or in combinations of them. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations of the invention have been described. Nevertheless, it will be understood that various modifications may be made without departing from the spirit and scope of the invention. Accordingly, other implementations are within the scope of the following claims.

What is claimed is:

1. An integrated circuit comprising:
    a plurality of logic circuits comprising:
        a first logic circuit; and
        a second logic circuit connected to the first logic circuit, wherein at least one of logic depth, a number of gates, a number of gate inputs and a number of gate outputs of the first logic circuit is greater than that of the second logic circuit; and
    a scan chain configured to test the plurality of logic circuits, the scan chain comprising:
        a first scan chain portion in communication with the first logic circuit for testing thereof based on a test pattern provided thereto;
        a second scan chain portion in communication with the second logic circuit for selectively testing thereof based on the test pattern provided thereto from the first scan chain portion; and
        a switching unit configured to select the test pattern output from one of the first scan chain portion and the second scan chain portion,
        wherein the second scan chain portion is configured not to test the second logic circuit when the switching unit selects the test pattern output from the first chain portion.

2. The integrated circuit of claim 1, wherein the scan chain further comprises:
    a scan input node in communication with the first scan chain portion and providing the test pattern thereto;
    a scan output node in communication with the switching unit and outputting the test pattern from the scan chain;
    a scan shift node in communication with the first and second scan chain portions and providing a scan shift signal for shifting the test pattern through the first and second scan chain portions; and
    a scan mode select node in communication with the switching unit and providing a scan mode select signal thereto for selecting the test pattern output from one of the first scan chain portion and the second scan chain portion.

3. The integrated circuit of claim 2, wherein the first scan chain portion comprises:
    an input node in communication with the scan input node to receive the test pattern therefrom;
    an output node in communication with the switching unit; and
    a plurality of first storage elements arranged in series between the input node and the output node of the first scan chain portion and configured to shift the test pattern based on the scan shift signal from the scan shift node.

4. The integrated circuit of claim 3, wherein the second scan chain portion comprises:
    an input node in communication with the output node of the first scan chain portion to receive the test pattern therefrom;
    an output node in communication with the switching unit; and
    a plurality of second storage elements arranged in series between the input node and the output node of the second scan chain portion and configured to shift the test pattern based on the scan shift signal from the scan shift node.

5. The integrated circuit of claim 4, wherein each of the first and second storage elements comprises a flip-flop.

6. The integrated circuit of claim 4, wherein the switching unit comprises:
    a first input node in communication with the output node of the first scan chain portion to receive the test pattern therefrom;
    a second input node in communication with the output node of the second scan chain portion to receive the test pattern therefrom;
    a scan mode select input node in communication with the scan mode select node to receive the scan mode signal; and
    an output node configured to selectively output the test pattern from one of the first and second scan chains based on the scan mode select signal.

7. An integrated circuit comprising:
    a plurality of logic circuits comprising:
        a first logic circuit; and
        a second logic circuit connected to the first logic circuit, wherein at least one of logic depth, a number of gates, a number of gate inputs and a number of gate outputs of the first logic circuit is greater than that of the second logic circuit; and
    means for testing the plurality of logic circuits comprising:
        first means for testing the first logic circuit based on a test pattern provided thereto;
        second means for selectively testing the second logic circuit based on the test pattern provided thereto from the first testing means; and
        means for selecting the test pattern output from one of the first testing means and the second testing means,
        wherein the second testing means is configured not to test the second logic circuit when the selecting means selects the test pattern output from the first testing means.

8. The integrated circuit of claim 7, wherein the means for testing further comprises:
    means for providing the test pattern to the first testing means; and
    means for providing a scan shift signal to the first and second testing means.

9. The integrated circuit of claim 8, wherein the first testing means comprises means for shifting the test pattern based on the scan shift signal.

10. The integrated circuit of claim 9, wherein the second testing means comprises means for shifting the test pattern based on the scan shift signal.

11. A method for testing an integrated circuit comprising a plurality of logic circuits and a scan chain configured to test the plurality of logic circuits, the plurality of logic circuits comprising a first logic circuit and a second logic circuit connected to the first logic circuit, wherein at least one of logic depth, a number of gates, a number of gate inputs and a number of gate outputs of the first logic circuit is greater than that of the second logic circuit, and the scan chain comprising first and second scan chain portions in communication with the first and second logic circuits, respectively, the method comprising the steps of:
    applying a test pattern to the first scan chain portion;
    testing the first logic circuit based on the test pattern;
    bypassing testing of the second logic circuit; and
    extracting the test pattern output from the first scan chain portion to test the first logic circuit only.

12. The method of claim 11, wherein, when it is determined to test both the first and second logic circuits, the method further comprises the steps of:
applying the test pattern from the first scan chain portion to the second scan chain portion; and
testing the second logic circuit based on the test pattern.

13. The method of claim 12, wherein the step of testing the second logic circuit comprises the step of shifting the test pattern through the second scan chain portion.

14. The method of claim 11, wherein the step of testing the first logic circuit comprises the step of shifting the test pattern through the first logic circuit.

15. A computer readable storage medium having a stored computer program embodying instructions, which, when executed by a computer, cause the computer to test an integrated circuit comprising a plurality of logic circuits and a scan chain for testing the plurality of logic circuits, the plurality of logic circuits comprising a first logic circuit and a second logic circuit connected to the first logic circuit, wherein at least one of logic depth, a number of gates, a number of gate inputs and a number of gate outputs of the first logic circuit is greater than that of the second logic circuit, and the scan chain comprising first and second scan chain portions in communication with the first and second logic circuits, respectively, the computer readable medium comprising:
instructions for applying a test pattern to the first scan chain portion;
instructions for testing the first logic circuit based on the test pattern;
instructions for bypassing testing of the second logic circuit; and
instructions for extracting the test pattern output from the first scan chain portion to test the first logic circuit only.

16. The computer readable storage medium of claim 15, further comprising:
instructions for applying the test pattern from the first scan chain portion to the second scan chain portion upon receiving the instruction to test both the first and second logic circuits; and
instructions for testing the second logic circuit based on the test pattern.

17. The computer readable storage medium of claim 16, wherein the instructions for testing the second logic circuit comprises instructions for shifting the test pattern through the second scan chain portion.

18. The computer readable storage medium of claim 15, wherein the instructions for testing the second logic circuit comprises instructions for shifting the test pattern through the second scan chain portion.

* * * * *